(12) United States Patent
Kobayashi

(10) Patent No.: US 6,777,981 B2
(45) Date of Patent: *Aug. 17, 2004

(54) LEVEL SHIFTING CIRCUIT

(75) Inventor: Toshifumi Kobayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/267,855

(22) Filed: Oct. 10, 2002

(65) Prior Publication Data
US 2003/0193348 A1 Oct. 16, 2003

(30) Foreign Application Priority Data
Apr. 15, 2002 (JP) ........................................ 2002-112486

(51) Int. Cl.[7] ................................................. H03L 5/00
(52) U.S. Cl. .............................. 326/81; 326/63; 326/68; 326/80; 327/333
(58) Field of Search .............................. 326/62, 68, 81, 326/83; 327/333

(56) References Cited

U.S. PATENT DOCUMENTS

| 5,751,166 | A | * | 5/1998 | Shieh et al. ................... 326/71 |
| 5,781,026 | A | * | 7/1998 | Chow ........................... 326/26 |
| 5,880,616 | A | * | 3/1999 | Park et al. .................... 327/333 |
| 6,002,290 | A | | 12/1999 | Avery et al. |
| 6,232,794 | B1 | | 5/2001 | Cox |
| 6,445,210 | B2 | * | 9/2002 | Nojiri ........................... 326/68 |
| 6,556,061 | B1 | | 4/2003 | Chen et al. |
| 6,670,841 | B2 | | 12/2003 | Kobayashi |
| 2002/0024374 | A1 | | 2/2002 | Ovens et al. |

FOREIGN PATENT DOCUMENTS

| JP | A 5-284005 | 10/1993 |
| JP | 9-172368 A | 6/1997 |

* cited by examiner

Primary Examiner—Vibol Tan
(74) Attorney, Agent, or Firm—Burns, Doane, Swecker & Mathis, L.L.P.

(57) ABSTRACT

A level shifting circuit includes a charging means consisting of a charging regulator circuit which charges a second node to a logic "H" by setting a second switching circuit to an ON state and thereafter brings back the second switching circuit to an OFF state when a first node is changed from a logic "H" to a logic "L" by a change of an input signal, and charges the first node to the logic "H" by setting a first switching circuit to the ON state and thereafter brings back the first switching circuit to the OFF state when the second node is changed from the logic "H" to the logic "L" by the change of the input signal.

2 Claims, 8 Drawing Sheets

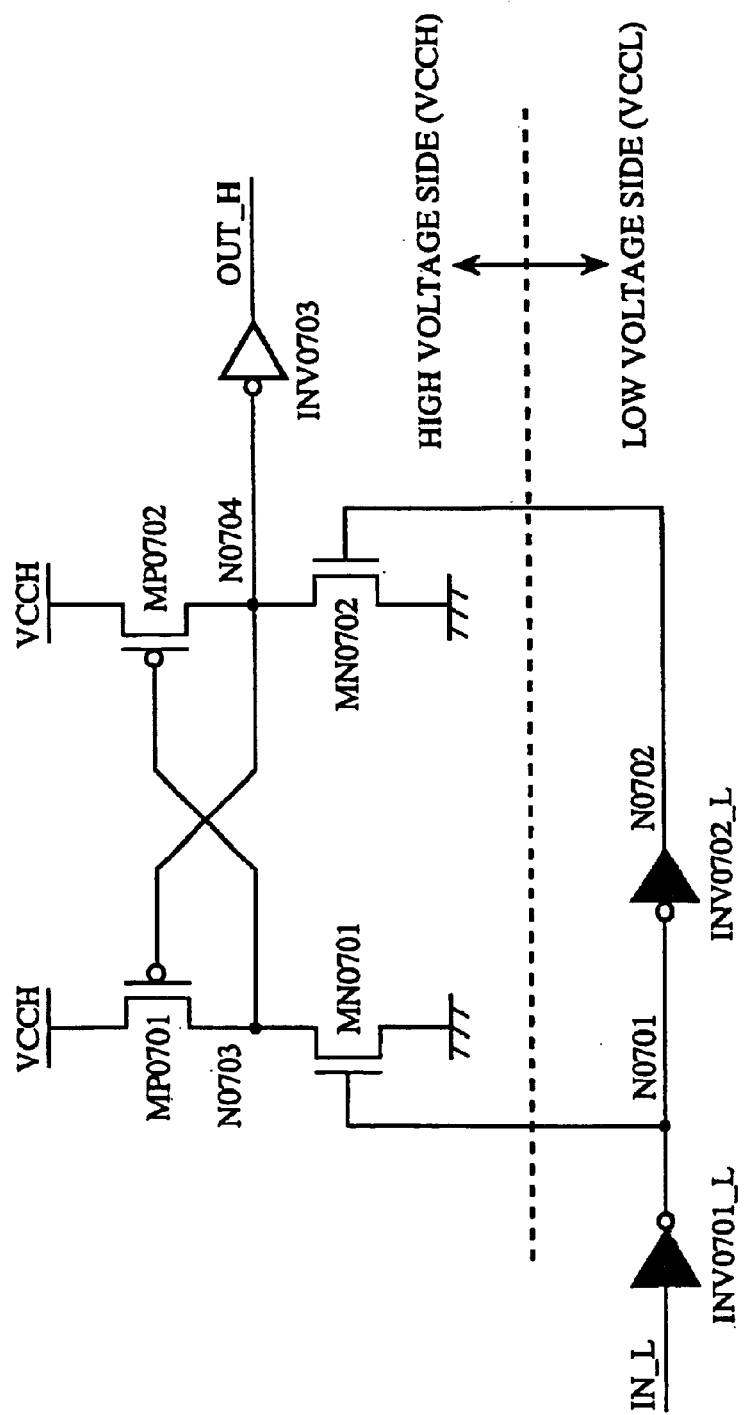
FIG. 7 CONVENTIONAL

FIG. 8    CONVENTIONAL
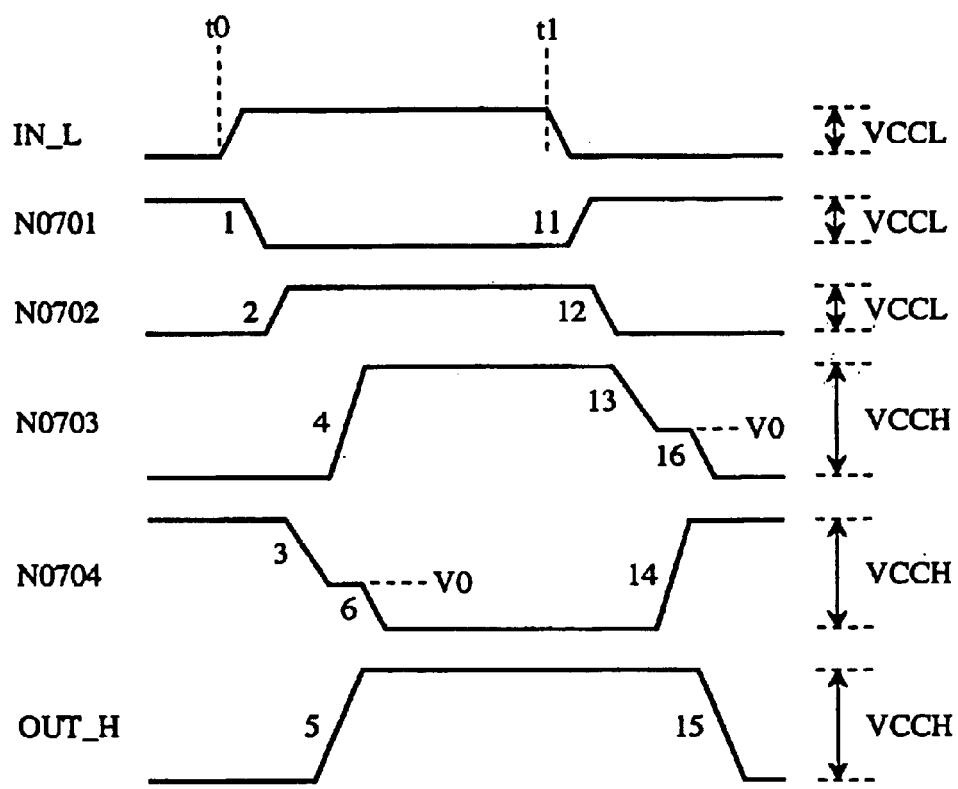

LEVEL SHIFTING CIRCUIT

BACKGROUND OF THE INVENTION

1. Field of the Invention

The present invention relates to a level shifting circuit for converting a logical level.

2. Description of Related Art

FIG. 7 is a circuit diagram to show a conventional level shifting circuit. In a semiconductor device using two types of voltage sources, a low voltage source (VCCL) and a high voltage source (VCCH), the level shifting circuit serves as a circuit which converts the logical level of the voltage VCCL into the logical level of the voltage VCCH (VCCL<VCCH). In FIG. 7, reference sign IN_L denotes an input signal having the logical level of the voltage VCCL, sign OUT_H denotes an output signal having the logical level of the voltage VCCH, signs INV0701_L and INV0702_L denote inverters operating by the low voltage source (VCCL), sign INV0703 denotes an inverter operating by the high voltage source (VCCH), signs MP0701 and MP0702 denote P-type transistors and signs MN0701 and MN0702 denote N-type transistors.

FIG. 8 is a waveform chart to show an operation of the conventional level shifting circuit.

Next, an operation will be discussed.

The operation of the level shifting circuit shown in FIG. 7 will be discussed below, referring to the waveform chart of FIG. 8. In the following discussion, the logic High level of the voltage VCCL is represented as "H_l" level, the logic High level of the voltage VCCH is represented as "H_h" level and the logic Low level (0 V) of these voltages are represented as "L" level.

In a state where the input signal IN_L is stationary at the "L" level, a node N0701 has the "H_l" level and a node N0702 has the "L" level, and the N-type transistor MN0701 is in an ON state and the N-type transistor MN0702 is in an OFF state. Further, a node N0703 has the "L" level and a node N0704 has the "H_h" level, and the P-type transistor MP0701 is in the OFF state and the P-type transistor MP0702 is in the ON state. The output signal OUT_H has the "L" level.

When the input signal IN_L changes from the "L" level to the "H_l" level (t0 of FIG. 8), the node N0701 comes into the "L" level and the node N0702 comes into the "H_l" level by the operations of the inverters INV0701_L and INV0702_L (1, 2 of FIG. 8) and the N-type transistor MN0701 comes into the OFF state and the N-type transistor MN0702 comes into the ON state. At this time, since the P-type transistor MP0702 remains in the ON state, the potential of the node N0704 falls to a voltage value V0 obtained by dividing the voltage VCCH by the ON-resistance of the P-type transistor MP0702 and the ON-resistance of the N-type transistor MN0702 (3 of FIG. 8). When the potential of the node N0704 becomes VCCH−VthP (VthP represents a threshold voltage of the P-type transistor) or lower, the P-type transistor MP0701 comes into the ON state and the node N0703 is charged up to the voltage VCCH (4 of FIG. 8) and when the potential of the node N0704 becomes the threshold voltage of the inverter INV0703 or lower, the output signal OUT_H becomes "H_h" level (5 of FIG. 8). Further, since the node N0703 is charged up to the voltage VCCH, the P-type transistor MP0702 comes into the OFF state and the node N0704 is completely discharged to 0 V (6 of FIG. 8).

When the input signal IN_L changes from the "H_l" level to the "L" level (t1 of FIG. 8), a series of operation is performed, almost like the above, where the node N0701 changes to the "H_l" level and the node N0702 changes to the "L" level (11, 12 of FIG. 8), the N-type transistor MN0701 comes into the ON state and the N-type transistor MN0702 comes into the OFF state, the potential of the node N0703 falls to V0 (13 of FIG. 8), the P-type transistor MP0702 comes into the ON state, the potential of the node N0704 rises up to the voltage VCCH (14 of FIG. 8), and then when the potential of the node N0704 becomes the threshold voltage of the inverter INV0703 or higher, the output signal OUT_H changes to the "L" level (15 of FIG. 8) and the potential of the node N0703 changes to 0 V (16 of FIG. 8).

As discussed above, there is a case in the conventional level shifting circuit, where the P-type transistor MP0701 and the N-type transistor MN0701 come into the ON state at the same time or where the P-type transistor MP0702 and the N-type transistor MN0702 come into the ON state at the same time (3, 13 of FIG. 8), and the voltage V0 of the node N0701 or the node N0702 at that time should be VCCH−VthP or lower. Assuming that the ON-resistance of the P-type transistor is RonP and the ON-resistance of the N-type transistor is RonN, since V0=VCCH*RonN/(RonP+RonN), it is necessary to satisfy a relation RonP>RonN in order to set V0 to a low value to some degree. Further, assuming that the channel width of a transistor is W and the channel length thereof is L, since the ON-resistance thereof is in proportion to L/W, it is necessary to set the channel width W smaller and/or the channel length L larger in order to increase the ON-resistance and it is necessary to set the channel width W larger and/or the channel length L smaller in order to decrease the ON-resistance.

Since the conventional level shifting circuit has the above constitution, since a gate-source voltage (VCCL) at the time when the N-type transistors MN0701 and MN0702 are in the ON state is lower than a gate-source voltage (−VCCH) at the time when the P-type transistors MP0701 and MP0702 are in the ON state, the ON-resistance RonN of the N-type transistor is hard to reduce even if L/W of the N-type transistors MN0701 and MN0702 is made smaller, and this tendency is accelerated as the difference between the voltage VCCH and the voltage VCCL becomes larger. Therefore, in order to satisfy the relation R on P>R on N, it is necessary to set the ON-resistance RonP extremely high. Since the nodes N0701 and N0702 are charged by the P-type transistors MP0701 and MP0702 (4, 14 of FIG. 8), however, the charging speed becomes lower when the ON-resistance RonP is extremely high, and this causes a problem that a delay time of the output signal OUT_H from the input signal IN_L may increase.

In contrast to this, though it is possible to satisfy the relation RonP>RonN with RonP kept low to some degree by setting L/W of the N-type transistors MN0701 and MN0702 extremely smaller than L/W of the P-type transistors MP0701 and MP0702, since a value (RonP+RonN) becomes small in this case, a through current which flows when the P-type transistor MP0701 and the N-type transistor MN0701 come into the ON state at the same time or the P-type transistor MP0702 and the N-type transistor MN0702 come into the ON state at the same time becomes large and this increases the power consumption.

SUMMARY OF THE INVENTION

The present invention is intended to solve the above described problems and it is an object of the present invention to provide a level shifting circuit which realized an increase of the potential difference allowing the logic-level conversion and a reduction of the delay time and the through current.

In the level shifting circuit in accordance with the present invention, a charging means is made up of a first P-type transistor and a second P-type transistor whose drains are connected to said first and second nodes respectively, whose gates are connected to said second and first nodes respectively and whose sources are connected to said second voltage source; a first switching circuit and a second switching circuit connected in parallel to said first and second P-type transistors respectively, and keeping an OFF state at a stationary state when said input signal does not change; and a charging regulator circuit which charges said second node to a logic "H" by setting said second switching circuit to an ON state and thereafter brings back said second switching circuit to an OFF state when said first node is changed from a logic "H" to a logic "L" by a change of said input signal, and charges said first node to the logic "H" by setting said first switching circuit to the ON state and thereafter brings back said first switching circuit to the OFF state when said second node is changed from the logic "H" to the logic "L" by the change of said input signal.

As discussed above, according to the present invention, since the ON-resistances of the first and second P-type transistors are set extremely high, a through current which flows when the first P-type transistor and the first N-type transistor come into the ON state at the same time or when the second P-type transistor and the second N-type transistor come into the ON state at the same time, can be made extremely small.

Further, even if the ON-resistances of the first and second N-type transistors become relatively large because the difference of the first and second voltage sources becomes large, it is possible to reduce the divided voltage value.

Furthermore, since no through current flows through the first and second switching circuits for charging the first and second nodes, it is possible to optimize the ON-resistances thereof with a high priority given to charging speed and avoid an increase in delay time caused by lower power consumption.

Thus, the present invention produces an effect of providing a level shifting circuit which increases the potential difference allowing the logic-level conversion and reduces the delay time and the through current.

BRIEF DESCRIPTION OF THE DRAWINGS

FIG. 7 is a circuit diagram to show a conventional level shifting circuit; and

FIG. 8 is a waveform chart to show an operation of the conventional level shifting circuit.

DETAILED DESCRIPTION OF THE PREFERRED EMBODIMENTS

Hereafter, the preferred embodiments of the present invention will be discussed.

First Preferred Embodiment

Figure 1:
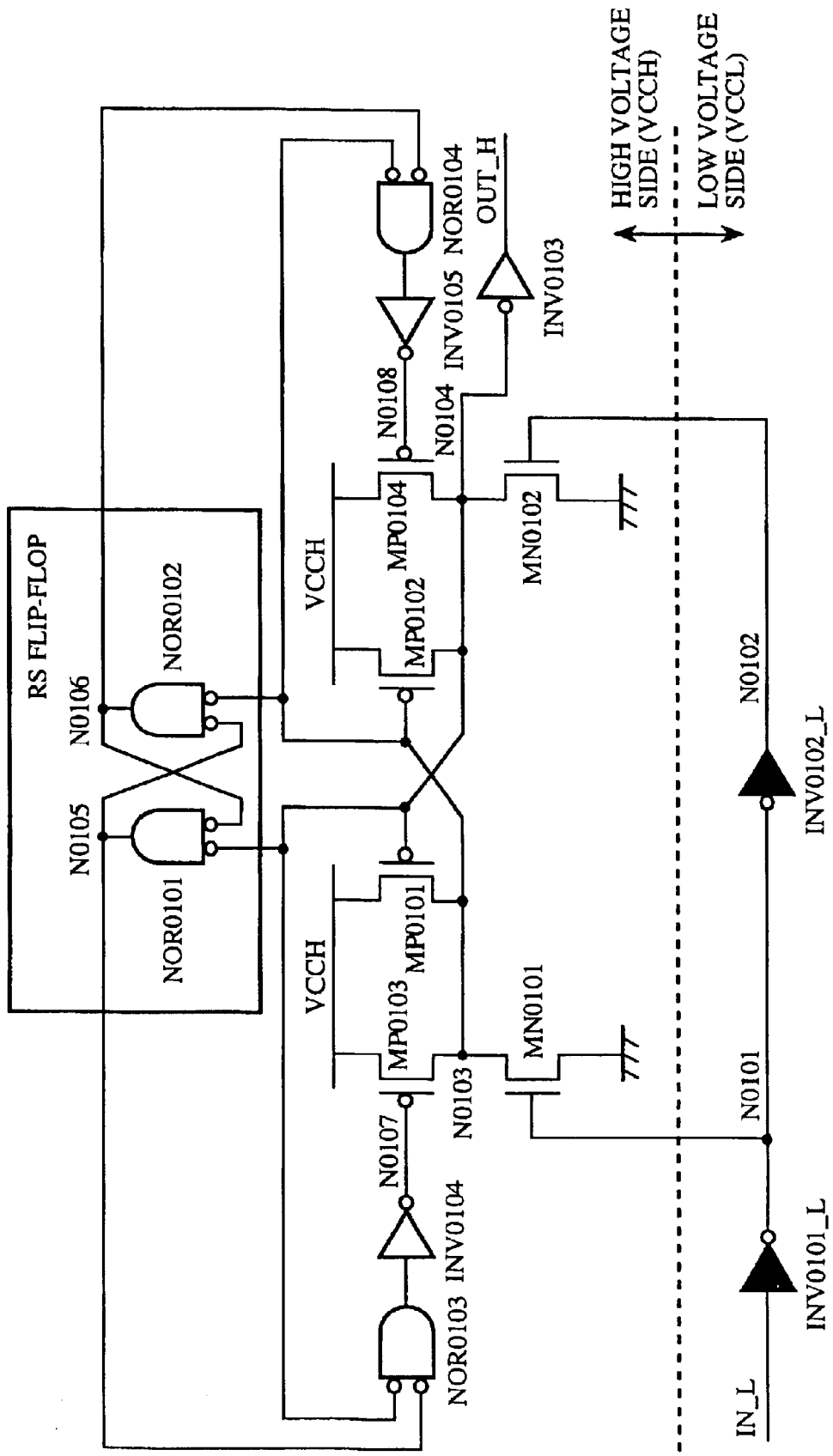
FIG. 1 is a circuit diagram to show a level shifting circuit in accordance with a first preferred embodiment of the present invention.

FIG. 1 is a circuit diagram to show a level shifting circuit in accordance with the first preferred embodiment of the present invention. In a semiconductor device using two types of voltage sources, a low voltage source (VCCL: the first voltage source) and a high voltage source (VCCH: the second voltage source), the level shifting circuit serves as a circuit which converts the logical level of the voltage VCCL into the logical level of the voltage VCCH. In FIG. 1, reference sign IN_L denotes an input signal having the logical level of the voltage VCCL and sign OUT_H denotes an output signal having the logical level of the voltage VCCH. Reference sign INV0101_L denotes an inverter operating by the low voltage source (VCCL), to which the input signal IN_L is inputted. Reference sign INV0102_L denotes an inverter operating by the low voltage source (VCCL), whose input is an output of the inverter INV0101_L (node N0101).

Reference sign MN0101 denotes an N-type transistor (the first N-type transistor) whose drain is connected to a node N0103 (the first node), gate is connected to the output of the inverter INV0101_L (node N0101) and source is grounded. Reference sign MN0102 denotes an N-type transistor (the second N-type transistor) whose drain is connected to a node N0104 (the second node), gate is connected to an output of the inverter INV0102_L (node N0102) and source is grounded.

Reference sign MP0101 denotes a P-type transistor (the first P-type transistor) whose drain is connected to the node N0103, gate is connected to the node N0104 and source is connected to the high voltage source (VCCH). Reference sign MP0102 denotes a P-type transistor (the second P-type transistor) whose drain is connected to the node N0104, gate is connected to the node N0103 and source is connected to the high voltage source (VCCH). Reference sign MP0103 denotes a P-type transistor (the first switching circuit, the third P-type transistor) connected in parallel to the P-type transistor MP0101, and sign MP0104 denotes a P-type transistor (the second switching circuit, the fourth P-type transistor) connected in parallel to the P-type transistor MP0102.

Reference signs NOR0101 and NOR0102 denote NOR gates (the first and second NOR gates) operating by the high voltage source (VCCH), whose respective outputs (node N0105 and node N0106) are connected to gate inputs of the other NOR gates, to form a RS flip-flop (charging regulator circuit). An input of this RS flip-flop on the side of NOR gate NOR0101 is connected to the node N0104 and an input on the side of NOR gate NOR0102 is connected to the node N0103. Reference sign NOR0103 denotes a NOR gate (charging regulator circuit, the third NOR gate) operating by the high voltage source (VCCH), whose input is connected to the nodes N0104 and N0105. Reference sign INV0104 denotes an inverter (charging regulator circuit, the first inverter) operating by the high voltage source (VCCH), whose input is connected to an output of the NOR gate NOR0103 and output is connected to a gate of the P-type transistor MP0103 (node N0107). Reference sign NOR0104 denotes a NOR gate (charging regulator circuit, the fourth NOR gate) operating by the high voltage source (VCCH), whose input is connected to the nodes N0103 and N0106. Reference sign INV0105 denotes an inverter (charging regulator circuit, the second inverter) operating by the high voltage source (VCCH), whose input is connected to an output of the NOR gate NOR0104 and output is connected to a gate of the P-type transistor MP0104 (node N0108).

Reference sign INV0103 denotes an inverter operating by the high voltage source (VCCH), whose input is connected to the node N0104 and output is the output signal OUT_H.

In the present constitution, the ON-resistances of the P-type transistors MP0101 and MP0102 are set extremely high and the ON-resistances of the P-type transistors MP0103 and MP0104 are set to a value which allows the nodes N0103 and N0104 to be charged at an adequate speed. The ON-resistances of the N-type transistors MN0101 and MN0102 are set to a value which allows the nodes N0103 and N0104 to be discharged at an adequate speed.

Figure 2:
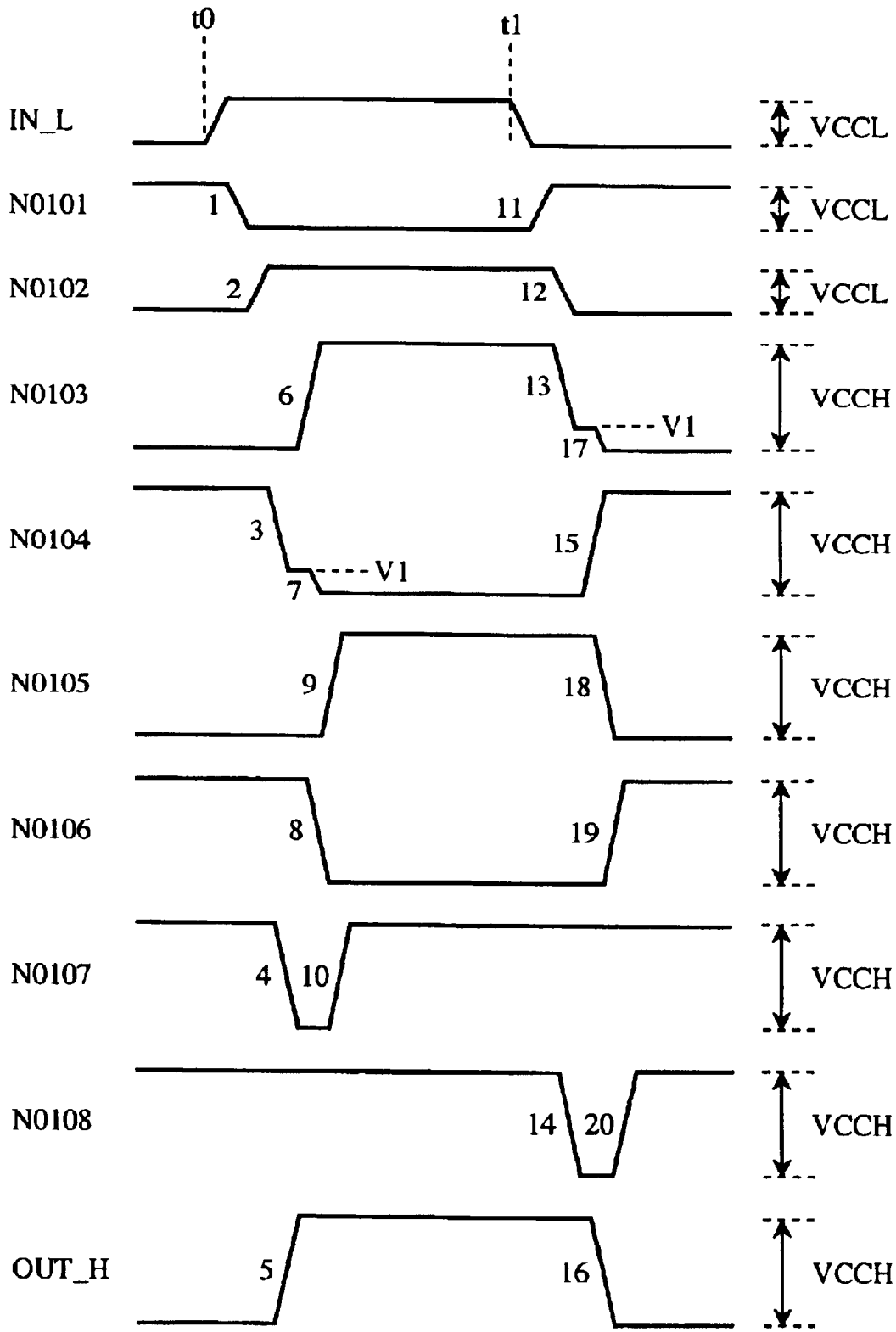
FIG. 2 is a waveform chart to show an operation of the level shifting circuit in accordance with the first preferred embodiment of the present invention.

FIG. 2 is a waveform chart to show an operation of the level shifting circuit in accordance with the first preferred embodiment of the present invention.

Next, an operation will be discussed.

The operation of the discussed-above level shifting circuit will be discussed below, referring to the waveform chart of FIG. 2.

In a state where the input signal IN_L is stationary at the "L" level, the node N0101 has the "H_l" level and the node N0102 has the "L" level, and the N-type transistor MN0101 is in an ON state and the N-type transistor MN0102 is in an OFF state. Further, the node N0103 has the "L" level and the node N0104 has the "H_h" level, and the P-type transistor MP0101 is in the OFF state and the P-type transistor MP0102 is in the ON state. The output signal OUT_H has the "L" level. In the RS flip-flop consisting of the NOR gates NOR0101 and NOR0102, the node N0105 is set to the "L" level and the node N0106 is set to the "H_h" level. Gates of the P-type transistors MP0103 and MP0104 (node N0107 and node N0108) both have the "H_h" level and the P-type transistors MP0103 and MP0104 are in the OFF state.

When the input signal IN_L changes from the "L" level to the "H_l" level (t0 of FIG. 2), the node N0101 comes into the "L" level and the node N0102 comes into the "H_l" level by the operations of the inverters INV0101_L and INV0102_L (1, 2 of FIG. 2) and the N-type transistor MN0101 comes into the OFF state and the N-type transistor MN0102 comes into the ON state. At this time, since the P-type transistor MP0102 remains in the ON state, the potential of the node N0104 falls to a voltage value V1 obtained by dividing the voltage VCCH by the ON-resistance of the P-type transistor MP0102 and the ON-resistance of the N-type transistor MN0102 (3 of FIG. 2). When the potential of the node N0104 becomes the threshold voltage of the NOR gate NOR0103 or lower, the node N0107 comes into the "L" level (4 of FIG. 2) and when the potential of the node N0104 becomes the threshold voltage of the inverter INV0103 or lower, the output signal OUT_H becomes "H_h" level (5 of FIG. 2). When the node N0107 comes into the "L" level, the P-type transistor MP0103 comes into the ON state to charge the node N0103 up to the voltage VCCH (6 of FIG. 2). When the node N0103 comes into the "H_h" level, the P-type transistor MP0102 comes into the OFF state and the node N0104 is completely discharged to 0 V (7 of FIG. 2), and in the RS flip-flop consisting of the NOR gates NOR0101 and NOR0102, the node N0105 is set to the "H_h" level and the node N0106 is set to the "L" level (8, 9 of FIG. 2). When the node N0105 comes into the "H_h" level, the node N0107 comes into the "H_h" level and the P-type transistor MP0103 comes into the OFF state (10 of FIG. 2). Since the P-type transistor MP0101 is in the ON state at the time when the potential of the node N0104 becomes VCCH−VthP (VthP represents the threshold voltage of the P-type transistor) or lower (3 of FIG. 2), the "H_h" level of the node N0103 is kept. The above is a series of operation of the level shifting circuit, which is caused by the change of the input signal IN_L from the "L" level to the "H_l" level.

An operation in the case where the input signal IN_L changes from the "H_l" level to the "L" level (t1 of FIG. 2) is the same as above, and potential changes of the respective nodes are shown by 11 to 20 of FIG. 2.

Thus, in the first preferred embodiment, since the ON-resistances of the P-type transistors MP0101 and MP0102 are set extremely high, the through current which flows when the P-type transistor MP0101 and the N-type transistor MN0101 come into the ON state at the same time or when the P-type transistor MP0102 and the N-type transistor MN0102 come into the ON state at the same time can be made extremely small. Moreover, even if the ON-resistances of the N-type transistors MN0101 and MN0102 becomes relatively larger as the difference between the voltage VCCL and the voltage VCCH becomes large, it is possible to reduce the value of V1. Further, since no through current flows through the P-type transistors MP0103 and MP0104 for charging the nodes N0103 and N0104, it is possible to optimize the ON-resistances thereof with a high priority given to charging speed and avoid an increase in delay time caused by lower power consumption.

Second Preferred Embodiment

Figure 3:
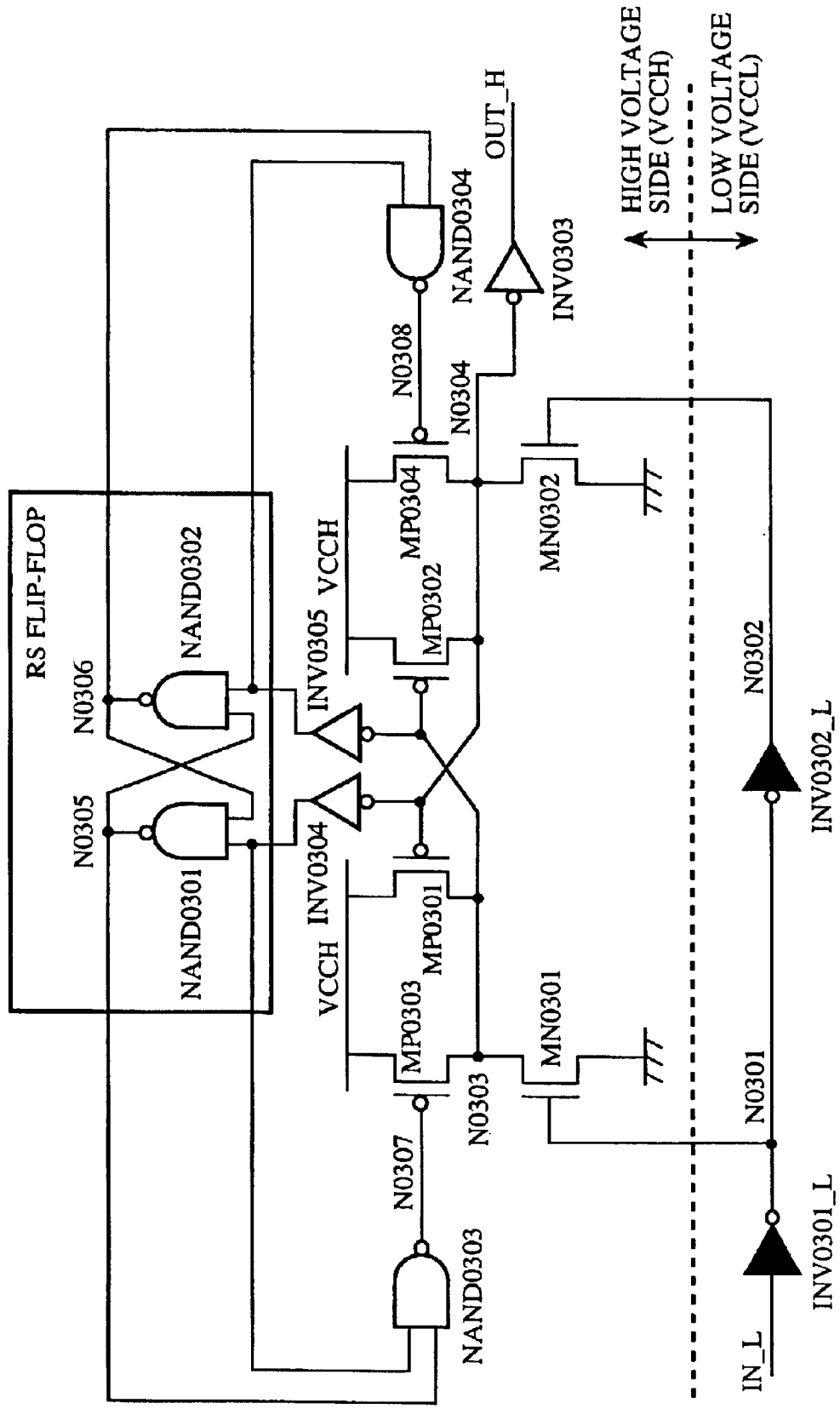
FIG. 3 is a circuit diagram to show a level shifting circuit in accordance with a second preferred embodiment of the present invention.

FIG. 3 is a circuit diagram to show a level shifting circuit in accordance with the second preferred embodiment of the present invention. In the second preferred embodiment, the NOR gates which are constituents of the first preferred embodiment are replaced by NAND gates.

In a semiconductor device using two types of voltage sources, the low voltage source (VCCL) and the high voltage source (VCCH), the level shifting circuit serves as a circuit which converts the logical level of the voltage VCCL into the logical level of the voltage VCCH. In FIG. 3 reference sign IN_L denotes the input signal having the logical level of the voltage VCCL and sign OUT_H denotes the output signal having the logical level of the voltage VCCH. Reference sign INV0301_L denotes an inverter operating by the low voltage source (VCCL), to which the input signal IN_L is inputted. Reference sign INV0302_L denotes an inverter operating by the low voltage source (VCCL), whose input is an output of the inverter INV0301_L (node N0301).

Reference sign MN0301 denotes an N-type transistor whose drain is connected to a node N0303, gate is connected to the output of the inverter INV0301_L (node N0301) and source is grounded. Reference sign MN0302 denotes an N-type transistor whose drain is connected to a node N0304, gate is connected to an output of the inverter INV0302_L (node N0302) and source is grounded.

Reference sign MP0301 denotes a P-type transistor whose drain is connected to the node N0303, gate is connected to the node N0304 and source is connected to the high voltage source (VCCH). Reference sign MP0302 denotes a P-type transistor whose drain is connected to the node N0304, gate is connected to the node N0303 and source is connected to the high voltage source (VCCH). Reference sign MP0303 denotes a P-type transistor connected in parallel to the P-type transistor MP0301, and sign MP0304 denotes a P-type transistor connected in parallel to the P-type transistor MP0302. Reference signs INV0304 and INV0305 denote inverters (charging regulator circuit, the first and second inverters) whose inputs are connected to the nodes N0304 and N0303 respectively, operating by the high voltage source (VCCH). Reference signs NAND0301 and NAND0302 denote NAND gates (the first and second NAND gates) operating by the high voltage source (VCCH) and the respective outputs (node N0305 and node N0306) are connected to gate inputs of the other NAND gates, to form a RS flip-flop. An input of this RS flip-flop on the side of NAND gate NAND0301 is connected to an output of the inverter INV0304 and an input on the side of NAND gate NAND0302 is connected to an output of the inverter INV0305. Reference sign NAND0303 denotes a NAND gate (charging regulator circuit, the third NAND gate) operating by the high voltage source (VCCH), whose input is connected to an output of the inverter INV0304 and the node N0305 and output is connected to a gate of the P-type transistor MP0303 (node N0307). Reference sign NAND0304 denotes a NAND gate (charging regulator circuit, the fourth NAND gate) operating by the high voltage source (VCCH), whose input is connected to an output of the inverter INV0305 and the node N0306 and output is connected to a gate of the P-type transistor MP0304 (node N0308).

Reference sign INV0303 denotes an inverter operating by the high voltage source (VCCH), whose input is connected to the node N0304 and output is the output signal OUT_H.

In the present constitution, the ON-resistances of the P-type transistors MP0301 and MP0302 are set extremely high and the ON-resistances of the P-type transistors MP0303 and MP0304 are set to a value which allows the nodes N0303 and N0304 to be charged at an adequate speed. The ON-resistances of the N-type transistors MN0301 and MN0302 are set to a value which allows the nodes N0303 and N0304 to be discharged at an adequate speed.

Figure 4:
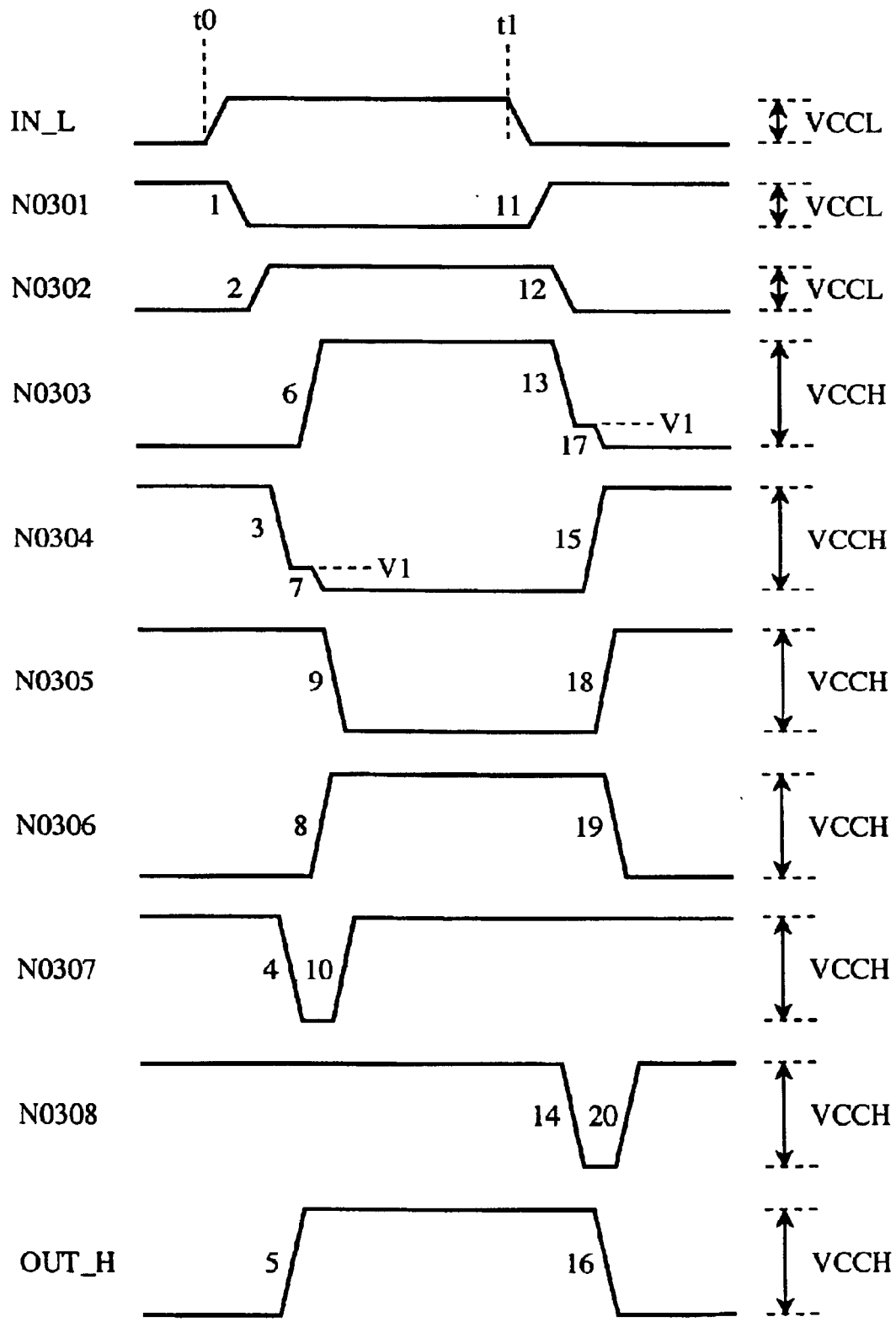
FIG. 4 is a waveform chart to show an operation of the level shifting circuit in accordance with the second preferred embodiment of the present invention.

FIG. 4 is a waveform chart to show an operation of the level shifting circuit in accordance with the second preferred embodiment of the present invention.

Next, an operation will be discussed.

The operation of the discussed-above level shifting circuit will be discussed below, referring to FIG. 4.

In a state where the input signal IN_L is stationary at the "L" level, the node N0301 has the "H_l" level and the node N0302 has the "L" level, and the N-type transistor MN0301 is in the ON state and the N-type transistor MN0302 is in the OFF state. Further, the node N0303 has the "L" level and the node N0304 has the "H_h" level, and the P-type transistor MP0301 is in the OFF state and the P-type transistor MP0302 is in the ON state. The output signal OUT_H has the "L" level. In the RS flip-flop consisting of the NAND gates NAND0301 and NAND0302, the node N0305 is set to the "H_h" level and the node N0306 is set to the "L" level. Gates of the P-type transistors MP0303 and MP0304 (node N0307 and node N0308) both have the "H_h" level and the P-type transistors MP0303 and MP0304 are in the OFF state.

When the input signal IN_L changes from the "L" level to the "H_l" level (t0 of FIG. 4), the node N0301 comes into the "L" level and the node N0302 comes into the "H_l" level by the operations of the inverters INV0301_L and INV0302_L (1, 2 of FIG. 4) and the N-type transistor MN0301 comes into the OFF state and the N-type transistor MN0302 comes into the ON state. At this time, since the P-type transistor MP0302 remains in the ON state, the potential of the node N0304 falls to a voltage value V1 obtained by dividing the voltage VCCH by the ON-resistance of the P-type transistor MP0302 and the ON-resistance of the N-type transistor MN0302 (3 of FIG. 4). When the potential of the node N0304 becomes the threshold voltage of the inverter INV0304 or lower, the node N0307 comes into the "L" level (4 of FIG. 4) and when the potential of the node N0304 becomes the threshold voltage of the inverter INV0303 or lower, the output signal OUT_H becomes "H_h" level (5 of FIG. 4). When the node N0307 comes into the "L" level, the P-type transistor MP0303 comes into the ON state and the node N0303 is charged up to the voltage VCCH (6 of FIG. 4). When the node N0303 comes into the "H_h" level, the P-type transistor MP0302 comes into the OFF state and the node N0304 is completely discharged to 0 V (7 of FIG. 4), and in the RS flip-flop consisting of the NAND gates NAND0301 and NAND0302, the node N0305 is set to the "L" level and the node N0306 is set to the "H_h" level (8, 9 of FIG. 4). When the node N0305 comes into the "L" level, the node N0307 comes into the "H_h" level and the P-type transistor MP0303 comes into the OFF state (10 of FIG. 4). Since the P-type transistor MP0301 is in the ON state at the time when the potential of the node N0304 becomes VCCH−VthP (VthP represents the threshold voltage of the P-type transistor) or lower (3 of FIG. 4), the "H_h" level of the node N0303 is kept. The above is a series of operation of the level shifting circuit, which is caused by the change of the input signal IN_L from the "L" level to the "H_l" level.

An operation in the case where the input signal IN_L changes from the "H_l" level to the "L" level (t1 of FIG. 4) is the same as above, and potential changes of the respective nodes are shown by 11 to 20 of FIG. 4.

Thus, in the second preferred embodiment, since the ON-resistances of the P-type transistors MP0301 and MP0302 are set extremely high, the through current which flows when the P-type transistor MP0301 and the N-type transistor MN0301 come into the ON state at the same time or when the P-type transistor MP0302 and the N-type transistor MN0302 come into the ON state at the same time can be made extremely small. Moreover, even if the ON-resistances of the N-type transistors MN0301 and MN0302 becomes relatively larger as the difference between the voltage VCCL and the voltage VCCH becomes large, it is possible to reduce the value of V1. Further, since no through current flows through the P-type transistors MP0303 and MP0304 for charging the nodes N0303 and N0304, it is possible to optimize the ON-resistances thereof with a high priority given to charging speed and avoid an increase in delay time caused by lower power consumption.

Third Preferred Embodiment

Figure 5:
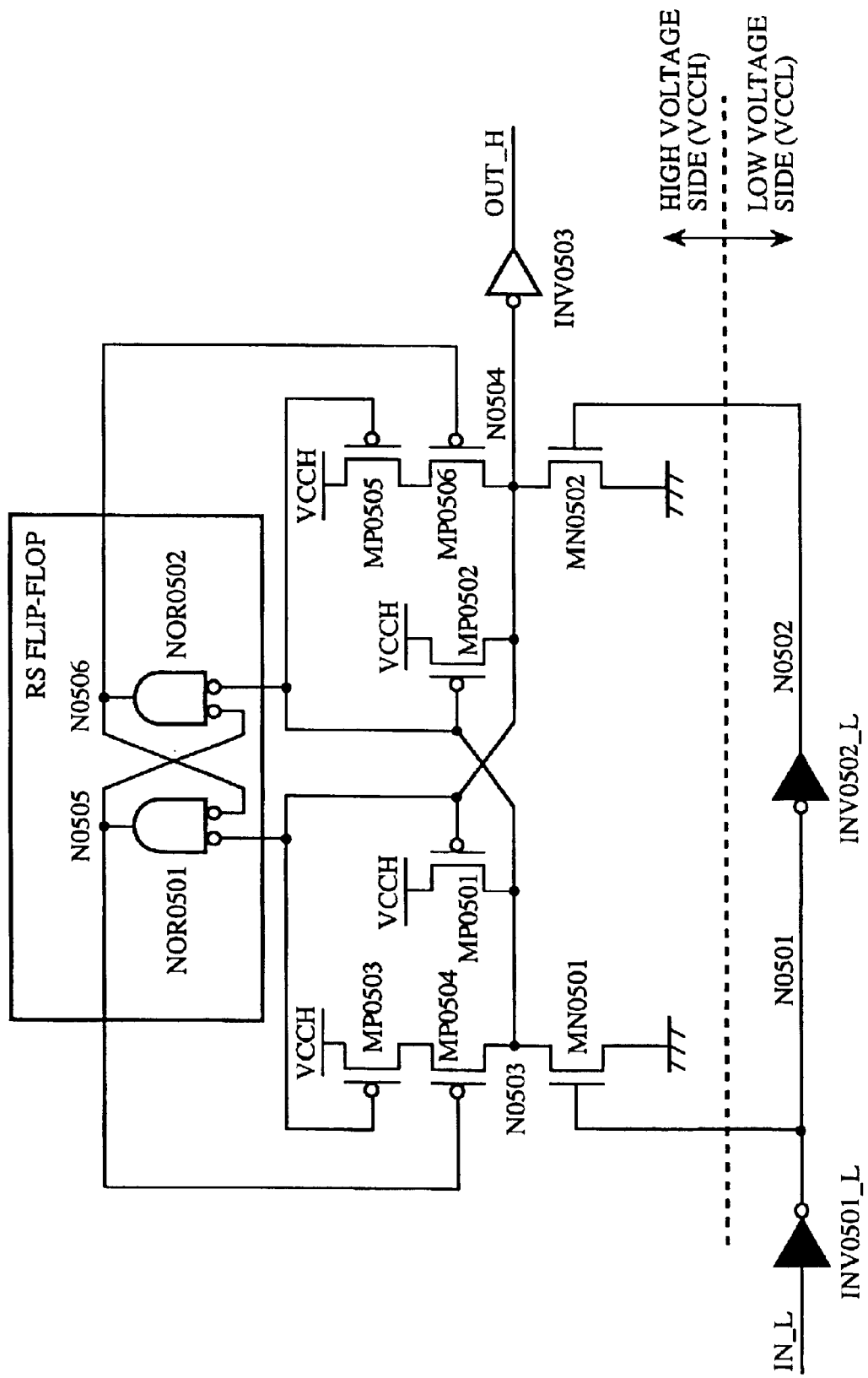
FIG. 5 is a circuit diagram to show a level shifting circuit in accordance with a third preferred embodiment of the present invention.

FIG. 5 is a circuit diagram to show a level shifting circuit in accordance with the third preferred embodiment of the present invention. In the third preferred embodiment, the logic gates which are constituents of the first preferred embodiment are reduced.

In a semiconductor device using two types of voltage sources, the low voltage source (VCCL) and the high voltage source (VCCH), the level shifting circuit serves as a circuit which converts the logical level of the voltage VCCL into the logical level of the voltage VCCH. In FIG. 5, reference sign IN_L denotes the input signal having the logical level of the voltage VCCL and sign OUT_H denotes the output signal having the logical level of the voltage VCCH. Reference sign INV0501_L denotes an inverter operating by the low voltage source (VCCL), to which the input signal IN_L is inputted. Reference sign INV0502_L denotes an inverter operating by the low voltage source (VCCL), whose input is an output of the inverter INV0501_L (node N0501).

Reference sign MN0501 denotes an N-type transistor whose drain is connected to a node N0503, gate is connected to the output of the inverter INV0501_L (node N0501) and source is grounded. Reference sign MN0502 denotes an N-type transistor whose drain is connected to a node N0504, gate is connected to an output of an inverter INV0502_L (node N0502) and source is grounded.

Reference sign MP0501 denotes a P-type transistor whose drain is connected to the node N0503, gate is connected to the node N0504 and source is connected to the high voltage source (VCCH). Reference sign MP0502 denotes a P-type transistor whose drain is connected to the node N0504, gate is connected to the node N0503 and source is connected to the high voltage source (VCCH). Reference signs NOR0501 and NOR0502 denote NOR gates operating by the high voltage source (VCCH), whose respective outputs (node N0505 and node N0506) are connected to gate inputs of the other NOR gates, to form a RS flip-flop. An input of this RS flip-flop on the side of NOR gate NOR0501 is connected to the node N0504 and an input on the side of NOR gate NOR0502 is connected to the node N0503. Reference signs MP0503 and MP0504 denote P-type transistors (the first switching circuit, the third and fourth P-type transistors) which are inserted, being connected in series to each other, between the high voltage source (VCCH) and the node N0503, and a gate of the P-type transistor MP0503 is connected to the node N0504 and a gate of the P-type transistor MP0504 is connected to the node N0505. Reference signs MP0505 and MP0506 denote P-type transistors (the second switching circuit, the fifth and sixth P-type transistors) which are inserted, being connected in series to each other, between the high voltage source (VCCH) and the node N0504, and a gate of the P-type transistor MP0505 is connected to the node N0503 and a gate of the P-type transistor MP0506 is connected to the node N0506.

Reference sign INV0503 denotes an inverter operating by the high voltage source (VCCH), whose input is connected to the node N0504 and output is the output signal OUT_H.

In the present constitution, the ON-resistances of the P-type transistors MP0501 and MP0502 are set extremely high. The ON-resistances of the P-type transistors MP0503 and MP0504 are set to a value which allows the node N0503 to be charged at an adequate speed, and the ON-resistances of the P-type transistors MP0505 and MP0506 are set to a value which allows the node N0506 to be charged at an adequate speed. The ON-resistances of the N-type transistors MN0501 and MN0502 are set to a value which allows the nodes N0503 and N0504 to be discharged at an adequate speed.

Figure 6:
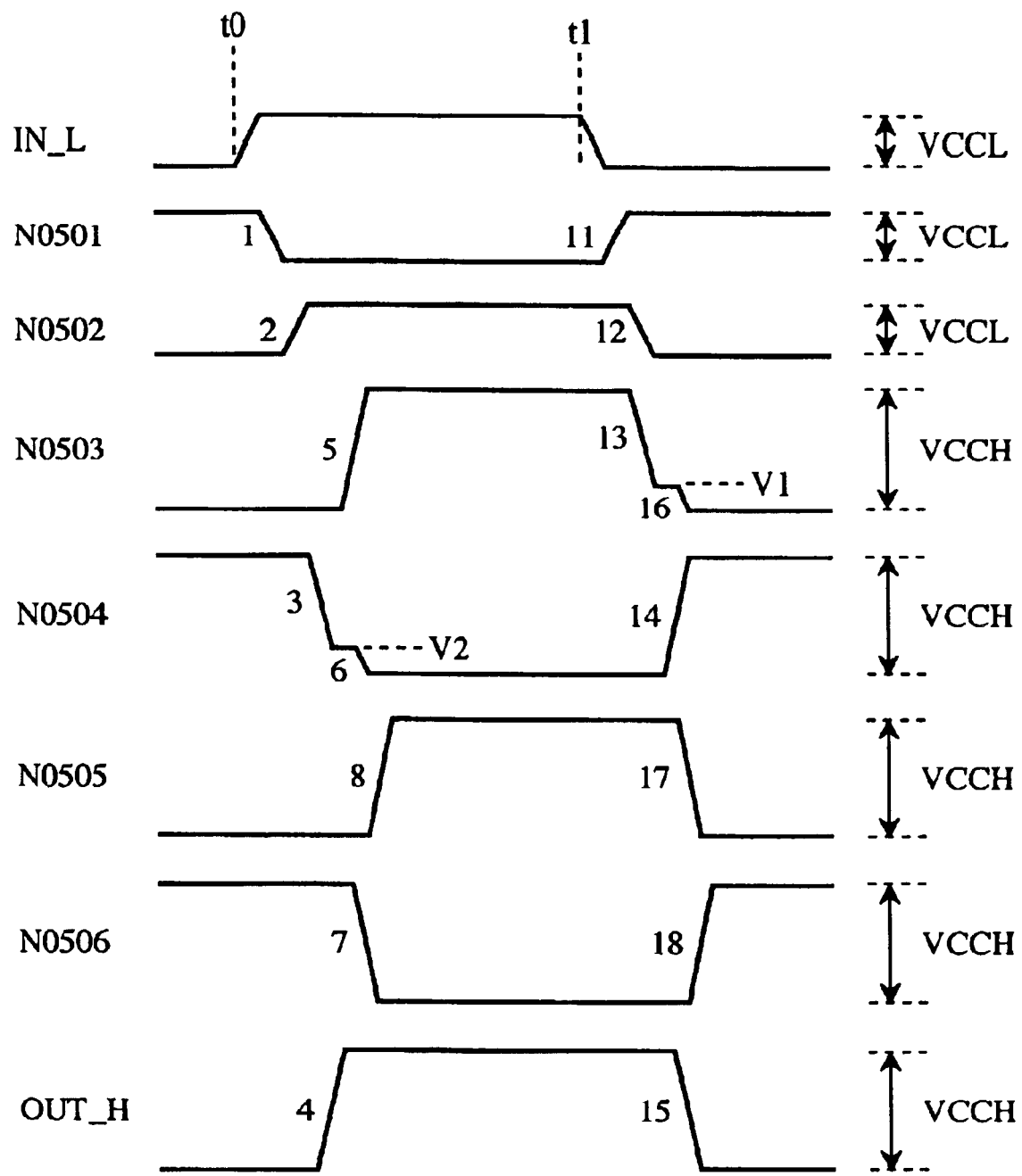
FIG. 6 is a waveform chart to show an operation of the level shifting circuit in accordance with the third preferred embodiment of the present invention.

FIG. 6 is a waveform chart to show an operation of the level shifting circuit in accordance with the third preferred embodiment of the present invention.

Next, an operation will be discussed.

The operation of the discussed-above level shifting circuit will be discussed below, referring to the waveform chart of FIG. 6.

In a state where the input signal IN_L is stationary at the "L" level, the node N0501 has the "H_l" level and the node N0502 has the "L" level, and the N-type transistor MN0501 is in the ON state and the N-type transistor MN0502 is in the OFF state. Further, the node N0503 has the "L" level and the node N0504 has the "H_h" level, and the P-type transistor MP0501 is in the OFF state and the P-type transistor MP0502 is in the ON state. The output signal OUT_H has the "L" level. In the RS flip-flop consisting of the NOR gates NOR0501 and NOR0502, the node N0505 is set to the "L" level and the node N0506 is set to the "H_h" level. At this time, the P-type transistor MP0503 is in the OFF state and the P-type transistor MP0504 is in the ON state, which are connected in series to each other, and the P-type transistor MP0505 is in the ON state and the P-type transistor MP0506 is in the OFF state, which are connected in series to each other.

When the input signal IN_L changes from the "L" level to the "H_l" level (t0 of FIG. 6), the node N0501 comes into the "L" level and the node N0502 comes into the "H_l" level by the operations of the inverters INV0501_L and INV0502_L (1, 2 of FIG. 6) and the N-type transistor MN0501 comes into the OFF state and the N-type transistor MN0502 comes into the ON state. At this time, since the P-type transistor MP0502 remains in the ON state, the potential of the node N0504 falls to a voltage value V1 obtained by dividing the voltage VCCH by the ON-resistance of the P-type transistor MP0502 and the ON-resistance of the N-type transistor MN0502 (3 of FIG. 6). When the potential of the node N0504 becomes VCCH−VthP (VthP represents the threshold voltage of the P-type transistor) or lower, the node N0503 comes into the ON state and when the potential of the node N0504 becomes the threshold voltage of the inverter INV0503 or lower, the output signal OUT_H becomes "H_h" level (4 of FIG. 6). When the node N0503 comes into the ON state, since the P-type transistors MP0503 and MP0504 which are connected in series to each other both come into the ON state, the node N0503 is charged up to the voltage VCCH (5 of FIG. 6). When the node N0503 comes into the "H_h" level, the P-type transistor MP0502 comes into the OFF state and the node N0504 is completely discharged to 0 V (6 of FIG. 6), and in the RS flip-flop consisting of the NOR gates NOR0501 and NOR0502, the node N0505 is set to the "H_h" level and the node N0506 is set to the "L" level (7, 8 of FIG. 6). When the node N0505 comes into the "H_h" level, the P-type transistor MP0504 comes into the OFF state. Since the P-type transistor MP0501 is in the ON state at the time when the potential of the node N0504 becomes VCCH−VthP (VthP represents the threshold voltage of the P-type transistor) or lower (3 of FIG. 6), the "H_h" level of the node N0503 is kept. The above is a series of operation of the level shifting circuit, which is caused by the change of the input signal IN_L from the "L" level to the "H_l" level.

An operation in the case where the input signal IN_L changes from the "H_l" level to the "L" level (t1 of FIG. 6) is the same as above, and potential changes of the respective nodes are shown by 11 to 18 of FIG. 6.

Thus, in the third preferred embodiment, since the ON-resistances of the P-type transistors MP0501 and MP0502 are set extremely high, the through current which flows when the P-type transistor MP0501 and the N-type transistor MN0501 come into the ON state at the same time or when the P-type transistor MP0502 and the N-type transistor MN0502 come into the ON state at the same time can be made extremely small. Moreover, even if the ON-resistances of the N-type transistors MN0501 and MN0502 becomes relatively larger as the difference between the voltage VCCL and the voltage VCCH becomes large, it is possible to reduce the value of V1. Further, since no through current flows through the P-type transistors MP0503 and MP0504, which are connected in series to each other, for charging the nodes N0503 and N0504, or through the P-type transistors MP0505 and MP0506, it is possible to optimize the ON-resistances thereof with a high priority given to charging speed and avoid an increase in delay time caused by lower power consumption.

What is claimed is:

1. A level shifting circuit comprising:

a discharging circuit to perform a discharge of a first node and a second node with a complementary input signal using a first voltage source as a power supply; and a charging circuit to perform a charge of said first node according to a logical level of said second node and to perform a charge of said second node according to a logical level of said first node by a second voltage source used as a power supply, wherein said discharging circuit comprises:

a first N-type transistor and a second N-type transistor whose drains are connected to said first and second nodes respectively, whose gates are respectively connected to said complementary input signal and whose sources are grounded; and said charging circuit comprises:

a first P-type transistor and a second P-type transistor whose drains are connected to said first and second nodes respectively, whose gates are connected to said second and first nodes respectively and whose sources are connected to said second voltage source;

a first switching circuit and a second switching circuit connected in parallel to said first and second P-type transistors respectively, and keeping an OFF state at a stationary state when said input signal does not change; and a charging regulator circuit which charges said second node to a logic "H" by setting said second switching circuit to an ON state, and thereafter brings back said second switching circuit to an OFF state when said first node is changed from the logic "H" to a logic "L" by a change of said input signal, and charges said first node to the logic "H" by setting said first switching circuit to the ON state and thereafter brings back said first switching circuit to the OFF state when said second node is changed from the logic "H" to the logic "L" by the change of said input signal, wherein said first and second switching circuits comprise:

a third P-type transistor and a fourth P-type transistor whose drains are connected to said first and second nodes respectively and whose sources are connected to said second voltage source respectively, and said charging regulator circuit comprises:

a RS flip-flop consisting of a first NOR gate whose input terminal is connected to said second node and a second NOR gate whose input terminal is connected to said first node;

a third NOR gate whose input terminal is connected to an output of said first NOR gate and said second node;

a fourth NOR gate whose input terminal is connected to an output of said second NOR gate and said first node;

a first inverter whose input terminal is connected to an output of said third NOR gate and whose output terminal is connected to a gate of said third P-type transistor; and a second inverter whose input terminal is connected to an output of said fourth NOR gate and whose output terminal is connected to a gate of said fourth P-type transistor.

2. A level shifting circuit comprising:

a discharging circuit to perform a discharge of a first node and a second node with a complementary input signal using a first voltage source as a power supply; and a charging circuit to perform a charge of said first node according to a logical level of said second node and to perform a charge of said second node according to a logical level of said first node by a second voltage source used as a power supply, wherein said discharging circuit comprises:

a first N-type transistor and a second N-type transistor whose drains are connected to said first and second nodes respectively, whose gates are respectively connected to said complementary input signal and whose sources are grounded; and said charging circuit comprises:

a first P-type transistor and a second P-type transistor whose drains are connected to said first and second nodes respectively, whose gates are connected to said second and first nodes respectively and whose sources are connected to said second voltage source;

a first switching circuit and a second switching circuit connected in parallel to said first and second P-type transistors respectively, and keeping an OFF state at a stationary state when said input signal does not change; and a charging regulator circuit which charges said second node to a logic "H" by setting said second switching circuit to an ON state and thereafter brings back said second switching circuit to an OFF state when said first node is changed from the logic "H" to a logic "L" by a change of said input signal, and charges said first node to the logic "H" by setting said first switching circuit to the ON state and thereafter brings back said first switching circuit to the OFF state when said second node is changed from the logic "H" to the logic "L" by the change of said input signal, wherein said first and second switching circuits comprise:

a third P-type transistor and a fourth P-type transistor whose drains are connected to said first and second nodes respectively and whose sources are connected to said second voltage source respectively, and said charging regulator circuit comprises:

a first inverter whose input terminal is connected to said second node;

a second inverter whose input terminal is connected to said first node:

a RS flip-flop consisting of a first NAND gate whose input terminal is connected to said first inverter and a second NAND gate whose input terminal is connected to said second inverter;

a third NAND gate whose input terminal is connected to an output of said first NAND gate and an output of said first inverter and whose output terminal is connected to a gate of said third P-type transistor; and a fourth NAND gate whose input terminal is connected to an output of said second NAND gate and an output of said, second inverter and whose output terminal is connected to a gate of said fourth P-type transistor.

* * * * *